(12) United States Patent
Yoon et al.

(10) Patent No.: US 10,192,673 B2
(45) Date of Patent: Jan. 29, 2019

(54) INDUCTOR

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 33 days.

(21) Appl. No.: 15/457,202

(22) Filed: Mar. 13, 2017

(65) Prior Publication Data

US 2018/0033538 A1    Feb. 1, 2018

(30) Foreign Application Priority Data

Jul. 27, 2016  (KR) .................. 10-2016-0095678

(51) Int. Cl.
| H01F 27/28 | (2006.01) |
| H01F 27/29 | (2006.01) |
| H01F 27/32 | (2006.01) |
| H01F 17/00 | (2006.01) |
| H01F 17/04 | (2006.01) |
| H05K 1/18 | (2006.01) |

(52) U.S. Cl.
CPC ..... *H01F 27/2804* (2013.01); *H01F 17/0013* (2013.01); *H01F 17/04* (2013.01); *H01F 27/29* (2013.01); *H01F 27/292* (2013.01); *H01F 27/323* (2013.01); *H01F 2017/048* (2013.01); *H01F 2027/2809* (2013.01); *H05K 1/181* (2013.01); *H05K 2201/1003* (2013.01); *H05K 2201/10636* (2013.01)

(58) Field of Classification Search
CPC ..... H01F 27/2804; H01F 27/29; H01F 27/323
USPC .................................................. 336/200, 232
See application file for complete search history.

(56) References Cited

U.S. PATENT DOCUMENTS

| 5,515,022 A * | 5/1996 | Tashiro .............. H01F 17/0013 174/262 |
| 5,821,846 A * | 10/1998 | Leigh .................. H01F 17/0006 336/200 |
| 8,482,371 B2 * | 7/2013 | Jeong ................. H01F 27/2804 336/192 |
| 2007/0069844 A1 | 3/2007 | Kudo et al. |
| 2013/0038419 A1 * | 2/2013 | Kobayashi ......... H01F 17/0013 336/200 |

(Continued)

FOREIGN PATENT DOCUMENTS

| JP | 2003-017327 A | 1/2003 |
| KR | 10-2016-0031390 A | 3/2016 |
| WO | 2005/071699 A1 | 8/2005 |

*Primary Examiner* — Tsz Chan
(74) *Attorney, Agent, or Firm* — McDermott Will & Emery LLP

(57) ABSTRACT

An inductor includes a body including a coil part therein. The coil part includes a support member and first and second coil patterns respectively formed on an upper surface and a lower surface of the support member, and 1.15≤b/a≤1.45, where a is a length from a central plane between the upper surface and the lower surface of the support member to an upper surface of the body, and b is a length from the central plane of the support member to a lower surface of the body.

16 Claims, 3 Drawing Sheets

(56) References Cited

U.S. PATENT DOCUMENTS

2014/0285305 A1* 9/2014 Yoo ................. H01F 27/2804
                                                336/200
2017/0140864 A1* 5/2017 Arai ...................... H01F 1/28

* cited by examiner

INDUCTOR

CROSS-REFERENCE TO RELATED APPLICATION(S)

This application claims the benefit of priority to Korean Patent Application No. 10-2016-0095678, filed on Jul. 27, 2016 in the Korean Intellectual Property Office, the disclosure of which is incorporated herein by reference in its entirety.

BACKGROUND

1. Technical Field

The present disclosure relates to an inductor.

2. Description of Related Art

Resonance, indicating frequency selection characteristics of screening or filtering out only a specific frequency on which energy concentrates, signifies a point at which an inductance component and a capacitance component coexist and are in an equilibrium state in terms of energy.

When exceeding a characteristic frequency, an inductor and a capacitor may not play their original roles and the inductor operates as a capacitor and the capacitor operates as an inductor. The frequency point at which the inductor and the capacitor do not play their original roles is the same as a resonance point, thus it may be termed a self-resonance frequency (SRF).

As a switching frequency of a DC-DC converter is increased, demand for inductors with SRF characteristics related to a high frequency is on the increase. In order to realize an inductor with enhanced SRF characteristics, parasitic capacitance Cp is required to be reduced.

In an inductor, parasitic capacitance may largely be generated between coils and in a space in which a coil and an external electrode face each other, to cause resonance at a high frequency, to reduce SRF characteristics.

Thus, a method for securing SRF characteristics by reducing the parasitic capacitance of the inductor is required.

SUMMARY

An aspect of the present disclosure may provide an inductor capable of securing self-resonance frequency (SRF) characteristics by reducing parasitic capacitance.

According to an aspect of the present disclosure, an inductor includes a body including a coil part therein. The coil part includes a support member and first and second coil patterns formed on an upper surface and a lower surface of the support member, and $1.15 \leq b/a \leq 1.45$, where a is a length from a central plane between the upper surface and the lower surface of the support member to an upper surface of the body, and b is a length from the central plane of the support member to a lower surface of the body.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Exemplary embodiments in the present disclosure will now be described in detail with reference to the accompanying drawings.

Hereinafter, an inductor according to an exemplary embodiment in the present disclosure will be described with reference to the accompanying drawings.

Figure 1:
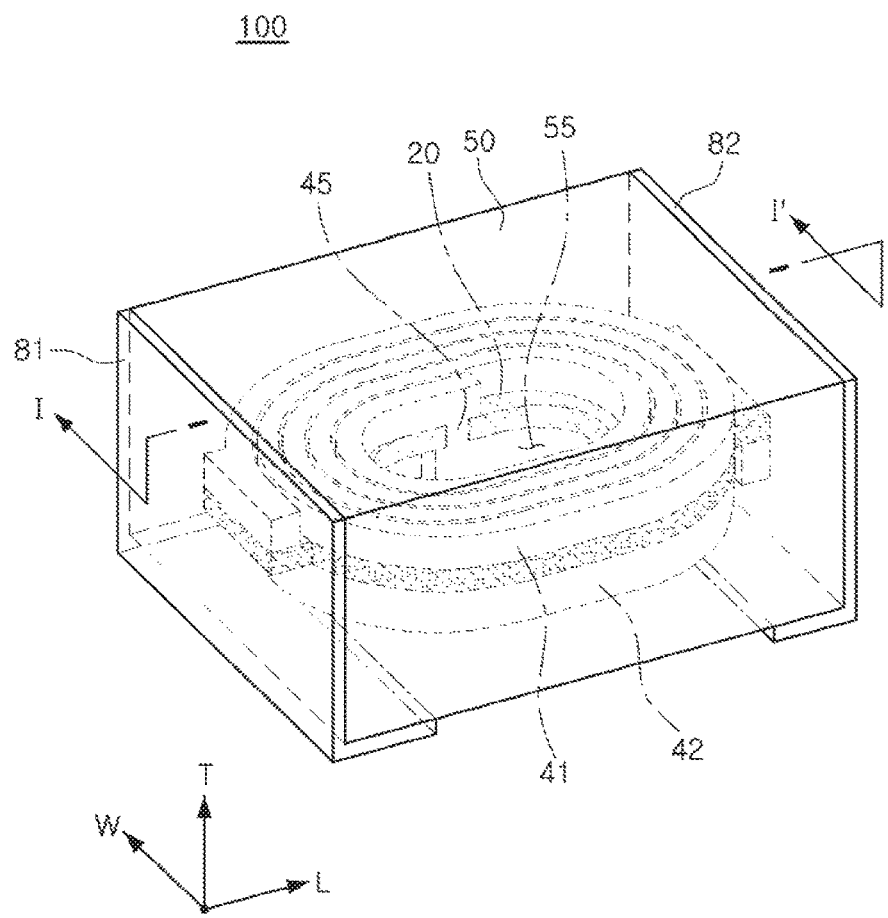
FIG. 1 is a schematic perspective view of an inductor including a coil part according to an exemplary embodiment in the present disclosure.
Figure 2:
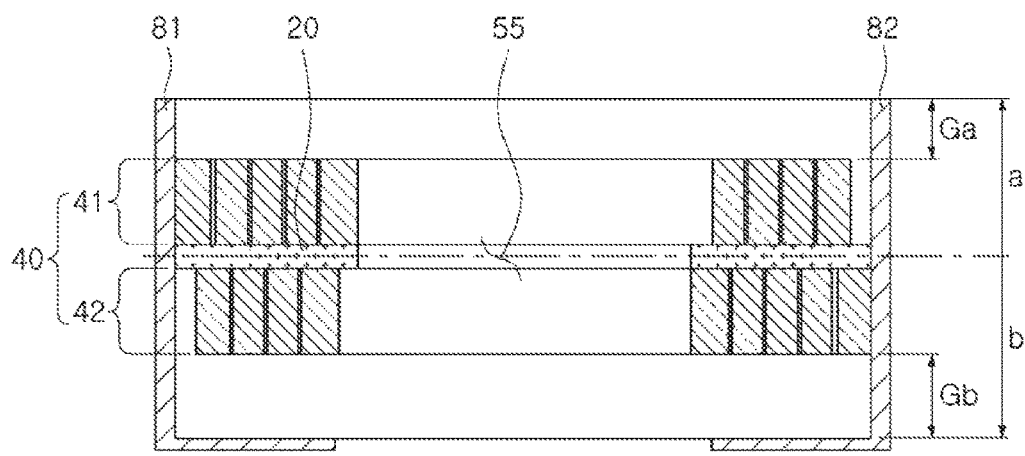
FIG. 2 is a cross-sectional view taken along line I-I' of FIG. 1.

FIG. 1 is a schematic perspective view of an inductor including a coil part according to an exemplary embodiment in the present disclosure, and FIG. 2 is a cross-sectional view taken along line I-I' of FIG. 1.

Referring to FIGS. 1 and 2, an inductor 100 according to an exemplary embodiment in the present disclosure includes a body 50 including an upper surface, a lower surface, and a side surface connecting the upper surface and the lower surface, and including a coil part. The coil part includes a support member 20 and first and second coil patterns 41 and 42 formed on an upper surface and a lower surface of the support member 20. A length a, from a central plane between the upper surface and the lower surface of the support member 20 to an upper surface of the body 50, and a length b from the central plane of the support member 20 to a lower surface of the body 50, satisfy $1.15 \leq b/a \leq 1.45$.

The body 50 forms an appearance of the inductor 100. In FIG. 1, L, W, and T indicate a length direction, a width direction, and a thickness direction, respectively. The body 50 may have a hexahedral shape including an upper surface and a lower surface opposing each other in a stacking direction (the thickness direction) of a coil layer, side surfaces opposing each other in the length direction, and a front surface and a rear surface opposing each other in the width direction. When the inductor 100 is mounted on a printed circuit board (PCB), the lower surface of the body 50 may be a mounting surface. Corners where the respective surfaces meet may be rounded through grinding, or the like.

The body 50 may include a magnetic material exhibiting magnetic characteristics.

The body 50 may be formed by forming a coil part, stacking sheets including a magnetic material on upper and lower surfaces of the coil part, and subsequently compressing and curing the sheets. The magnetic material may be, for example, a resin including ferrite or a magnetic metal particle.

The body 50 may be in a form in which ferrite or a magnetic metal particle is dispersed in a resin.

The ferrite may include a material such as Mn—Zn-based ferrite, Ni—Zn-based ferrite, NI—Zn—Cu-based ferrite, Mn—Mg-based ferrite, Ba-based ferrite, or Li-based ferrite, and the like.

The magnetic metal particle may include one or more selected from the group consisting of iron (Fe), silicon (Si), chromium (Cr), aluminum (Al), and nickel (Ni). For example, the magnetic metal particle may be a Fe—Si—

B—Cr-based amorphous metal but is not limited thereto. A diameter of the magnetic metal particle may be about 0.1 to 30 μm.

The resin may be a thermosetting resin such as an epoxy resin or a polyimide resin.

The coil part may perform various functions in an electronic device through characteristics manifested from a coil of the inductor 100. For example, the inductor 100 may be a power inductor, and here the coil part may serve to store electricity in the form of a magnetic field to maintain an output voltage to stabilize power.

The coil part includes first and second coil patterns 40 respectively formed on the upper surface and the lower surface of the support member 20. The first and second coil patterns 40 are coil layers disposed to face each other with respect to the support member 20.

The first and second coil patterns 41 and 42 may be formed through a photolithography method or a plating method.

In general, an inductor structure includes a body formed of a magnetic material and external electrodes formed to cover both sides of the body, and a central line of the body in the thickness direction is the same as a central line of the coil part, i.e., a central line of the support member 20. Here, parasitic capacitance is formed between the external electrodes formed on the upper surface and the lower surface of the body and the coil patterns 40, lowering self-resonance frequency (SRF) characteristics of the inductor 100.

In the inductor 100 according to the present disclosure, the central line of the support member 20 is moved upwards within the body 50 to increase a distance between external electrodes 81 and 82 formed on the lower surface of the body 50 and the second coil pattern 42 formed on the lower surface of the support member 20.

In detail, the coil part is positioned to be closer to the upper surface of the body 50 than to the lower surface of the body 50. When a length from the central plane between the upper surface and the lower surface of the support member 20 to the upper surface of the body 50 is a and a length from the central plane of the support member 20 to the lower surface of the body is b, a<b is satisfied. Accordingly, parasitic capacitance generated between the external electrode formed on the lower surface of the body 50 and the second coil pattern 42 may be removed to enhance SRF characteristics.

In the case in which the central plane of the support member 20 is moved upwards, that is, toward the upper surface of the body 50, inductance may be reduced but the reduced inductance may be complemented by increasing a volume of the body 50 by a thickness of the external electrode not formed on the upper surface of the body 50.

The first coil pattern 41 may have the same height as that of the second coil pattern 42, and here, a length Ga from an upper surface of the first coil pattern 41 to the upper surface of the body 50 may be smaller than a length Gb from a lower surface of the second coil pattern 42 to the lower surface of the body 50.

Figure 3:
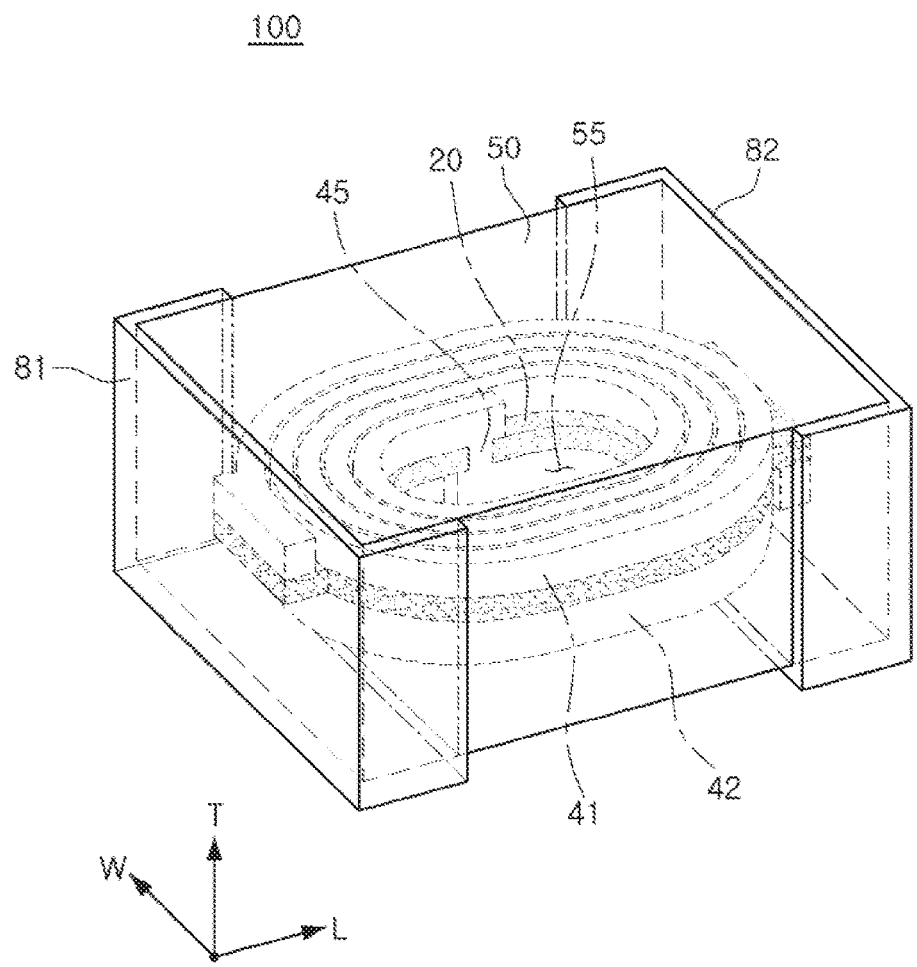
FIG. 3 is a schematic perspective view of an inductor according to another exemplary embodiment in the present disclosure.

FIG. 3 is a schematic perspective view of an inductor according to another exemplary embodiment in the present disclosure.

Referring to FIGS. 1 and 3, the inductor 100 includes the first and second external electrodes 81 and 82 electrically connected to the first and second coil patterns 41 and 42 and extending from the lower surface of the body to the side surfaces of the body. The first and second external electrodes 81 and 82 are formed in regions of the body 50 excluding the upper surface of the body 50.

In FIG. 1, it is illustrated that the first and second external electrodes 81 and 82 extend from the lower surface of the body 50 to the side surfaces of the body 50, and in FIG. 3, it is illustrated that the first and second external electrodes 81 and 82 extend from the lower surface of the body 50 to the side surfaces, front surface, and rear surface.

When the first and second external electrodes 81 and 82 are not formed on the upper surface of the body 50, parasitic capacitance is not formed between the external electrode and the first coil pattern on the upper surface of the body 50, enhancing SRF characteristics of the inductor 100.

The first and second external electrodes 81 and 82 are electrically connected to lead-out terminals of each of the first and second coil patterns 41 and 42 exposed to both side surfaces of the body 50.

When the inductor is mounted in an electronic device, the first and second external electrodes 81 and 82 serves to electrically connect the coil part of the inductor 100 to the electronic device.

The first and second external electrodes 81 and 82 may be formed of conductive paste including a conductive metal, and the conductive metal may be at least one of copper (Cu), nickel (Ni), tin (Sn), and silver (Ag), or an alloy thereof.

The first and second external electrodes 81 and 82 may include a plating layer formed on the paste layer.

The plating layer may include one or more selected from the group consisting of nickel (Ni), copper (Cu), and tin (Sn), and, for example, a nickel layer and a tin layer may be sequentially formed therein.

According to the present disclosure, the length a, from the central plane between the upper surface and the lower surface of the support member 20 to the upper surface of the body 50, and the length b, from the central plane of the support member 20 to the lower surface of the body 50, satisfy $1.15 \leq b/a \leq 1.45$.

Figure 4:
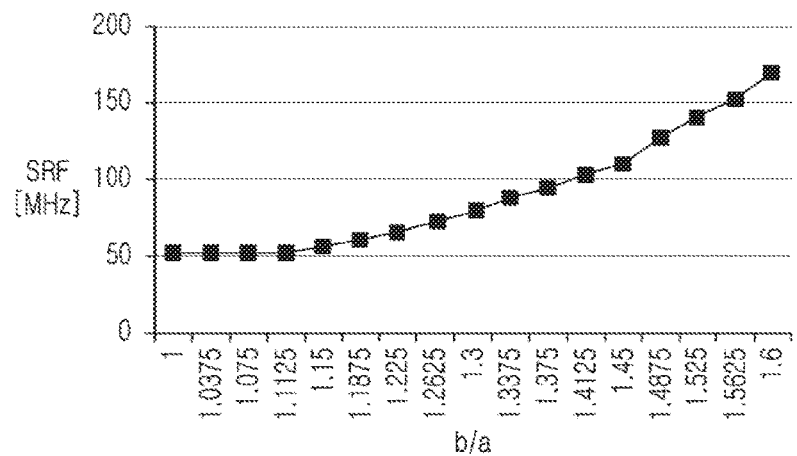
FIG. 4 is a graph illustrating self-resonance frequency (SRF) characteristics in accordance with a b/a value according to an exemplary embodiment in the present disclosure.
Figure 5:
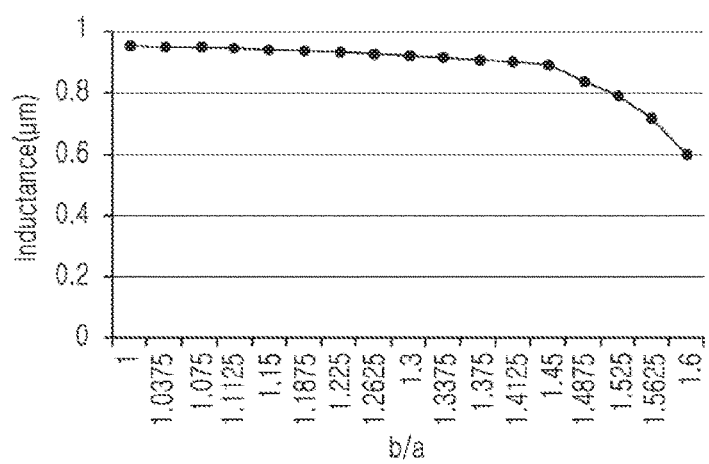
FIG. 5 is a graph illustrating inductance characteristics in accordance with a b/a value.

FIG. 4 is a graph illustrating self-resonance frequency (SRF) characteristics in accordance with a b/a value according to an exemplary embodiment in the present disclosure, and FIG. 5 is a graph illustrating inductance characteristics in accordance with a b/a value.

In an exemplary embodiment in the present disclosure, an external electrode is not formed on the upper surface of the body 50 and the value b/a is changed.

Referring to FIGS. 4 and 5, it can be seen that, as the value b/a is increased, the SRF characteristics are enhanced but an inductance value is reduced, and it can also be ascertained that a range of b/a, within which the SRF characteristics are enhanced and the secured inductance value is secured, is $1.15 \leq b/a \leq 1.45$.

If the value b/a is less than 1.15, a reduction effect of parasitic capacitance is too small to secure the SRF characteristics, and if the value b/a exceeds 1.45, the SRF characteristics may be increased but inductance may be reduced. Thus, the range of b/a is preferably $1.15 \leq b/a \leq 1.45$.

The support member 20 may not be limited as to a material or type as long as it is able to support the first and second coil patterns 40. For example, the support member 20 may be a copper clad laminate (CCL), a polypropyleneglycol (PPG) substrate, a ferrite substrate, a metal-based soft magnetic substrate, and the like. Also, the support member 20 may be an insulating substrate formed of an insulating resin. As the insulating resin, a thermosetting resin such as an epoxy resin, a thermoplastic resin such as polyimide, or a resin obtained by impregnating the thermosetting resin or the thermoplastic resin with a stiffener such as a glass fiber or an inorganic filler, for example, prepreg, Ajinomoto build-up film (ABF), FR-4, a bismaleimide triazine (BT) resin, a photo imageable dielectric (PID) resin, and the like, may be used. From the vantage point of maintaining rigidity, an insulating substrate including a glass fiber or an epoxy resin may be used but is not limited thereto.

In the upper surface and the lower surface of the support member 20, a central portion is penetrated, to form a hole, and the hole may be filled with a magnetic material such as ferrite, a magnetic metal particle, and the like, to form a core part. Formation of the core part filled with the magnetic material may enhance inductance L.

The first coil pattern 41 and the second coil pattern 42, stacked on opposing surfaces of the support member 20, are electrically connected to each other through a via 45 penetrating through the support member 20.

The via 45 may be formed by forming a through hole using mechanical drilling, laser drilling, and the like, and subsequently filling the inside of the through hole with a conductive material by means of plating.

The via 45 may not be limited in shape or material as long as it is able to electrically connect the upper first coil pattern 41 and the lower second coil pattern 42, respectively disposed on opposing surfaces of the support member 20. Here, the upper side and the lower side are determined with respect to a stacking direction of the coil pattern in the drawing.

The via 45 may include a conductive material such as copper (Cu), aluminum (Al), silver (Ag), tin (Sn), gold (Au), nickel (Ni), lead (Pd), an alloy thereof, and the like.

The via 45 is formed to electrically connect the first coil layers (first and second inner layer coils) formed on upper and lower surfaces of the support member 20, and, in this case, the via 45 may be formed by burning an interlayer insulating material, using laser machining. When the via 45 is formed, a size thereof is increased as a thickness of the support member 20 is larger, and, in this case, when the size of the via is increased, a volume of the coil may be increased, to increase a non-magnetic region within the inductor 100, to result in a problem of a reduction in current characteristics to be realized by the inductor 100.

A cross-section of the via 45 may have a trapezoid shape or a sandglass shape.

A cross-section of the via 45 may have a sandglass shape. This shape may be realized by machining the upper surface of the lower surface of the support member 20, whereby a width of the cross-section of the via 45 may be reduced. The width of the cross-section of the via 45 may range from 60 to 80 µm but is not limited thereto.

The first and second coil patterns 41 and 42 are covered by an insulating film (not shown) and are not in direct contact with the magnetic material of the body 50.

The insulating film serves to protect the first and second coil patterns 41 and 42.

The insulating film may be formed of any material as long as the material includes an insulating material including, for example, an insulating material used for general insulating coating, for example, an epoxy resin, a polyimide resin, a liquid crystal polymer resin, and the like. In addition, a known photo imageable dielectric (PID) resin, or the like, may also be used, but the insulating material is not limited thereto.

As set forth above, according to an exemplary embodiment in the present disclosure, SRF characteristics may be enhanced by reducing parasitic capacitance.

While example embodiments have been shown and described above, it will be apparent to those skilled in the art that modifications and variations could be made without departing from the scope of the present invention as defined by the appended claims.

What is claimed is:

1. An inductor comprising:
   a body comprising a magnetic material and having an upper surface, a lower surface, and side surfaces connecting the upper surface and the lower surface; and
   a coil part disposed in the body and including a support member comprising an insulating resin, the coil part comprising first and second coil patterns respectively formed on an upper surface and a lower surface of the support member, wherein
   $1.15 \leq b/a \leq 1.45$, where a is a length from a central plane between the upper surface and the lower surface of the support member to an upper surface of the body, and b is a length from the central plane of the support member to the lower surface of the body.

2. The inductor of claim 1, wherein the coil part further comprises first and second external electrodes electrically connected to the first and second coil patterns, respectively, and extending from the lower surface of the body to the side surfaces of the body.

3. The inductor of claim 2, wherein the first and second external electrodes are not formed on an upper surface of the body.

4. The inductor of claim 1, wherein a length from an upper surface of the first coil pattern to the upper surface of the body is shorter than a length from a lower surface of the second coil pattern to the lower surface of the body.

5. The inductor of claim 1, wherein the first coil pattern has the same height as that of the second coil pattern.

6. An inductor comprising:
   a body comprising a magnetic material and including a coil part therein,
   wherein the coil part includes a support member comprising an insulating resin and first and second coil patterns respectively formed on an upper surface and a lower surface of the support member, and
   $1.15 \leq b/a \leq 1.45$, where a is a length from a first surface of the body to a central plane of the support member, and b is a length from a second surface of the body opposing the first surface to the central plane of the support member.

7. The inductor of claim 6, wherein the coil part further comprises first and second external electrodes electrically connected to the first and second coil patterns, respectively, and extending from the second surface of the body to the side surfaces of the body.

8. The inductor of claim 7, wherein the first and second external electrodes are not formed on the first surface of the body.

9. The inductor of claim 6, wherein the coil part is positioned to be closer to the first surface of the body than to the second surface of the body.

10. The inductor of claim 6, wherein the first coil pattern has the same height as that of the second coil pattern.

11. The inductor of claim 6, wherein the second surface of the body is a mounting surface when the inductor is mounted on a printed circuit board (PCB).

12. An inductor comprising:
   a coil part comprising a first coil pattern disposed on a first surface of a support member and a second coil pattern disposed on a second surface of the support member, the second surface opposing the first surface;
   a body enclosing the coil part, wherein
   $1.15 \leq b/a \leq 1.45$, where a is a length from a central plane between the first surface and the second surface of the support member to an upper surface of the body, and b is a length from the central plane of the support member to a lower surface of the body, and the support member comprises an insulating resin and the body comprising a magnetic material.

13. The inductor of claim 12, further comprising a first external electrode connected to the first coil pattern and a second external electrode connected to the second coil pattern, wherein the first and second external electrodes disposed on respective side surfaces of the body and extend to the lower surface of the body.

14. The inductor of claim 12, wherein the first and second coil patterns are connected to each other by a via penetrating through the support member.

15. The inductor of claim 12, wherein the first coil pattern includes a first connecting part in contact with a first external electrode and the second coil pattern includes a second connecting part in contact with a second external electrode, wherein the first and second external electrodes disposed on respective side surfaces of the body and extend to the lower surface of the body.

16. The inductor of claim 12, wherein the first coil pattern is exposed to a first side surface of the body and the second coil pattern is exposed to a second side surface of the body opposing the first side surface.

* * * * *